United States Patent [19]

Merriweather

[11] 4,241,342
[45] Dec. 23, 1980

[54] MEASUREMENT INDICATING APPARATUS AND METHOD

[75] Inventor: Kenneth A. Merriweather, Madison Township, Dayton County, Ohio

[73] Assignee: The Bendix Corporation, Southfield, Mich.

[21] Appl. No.: 16,706

[22] Filed: Mar. 1, 1979

[51] Int. Cl.³ .............................................. G06F 3/147
[52] U.S. Cl. ........................................ 340/753; 324/96; 340/791; 340/782; 340/706; 364/481; 364/556
[58] Field of Search ....................... 340/753, 754, 791; 324/96; 235/92 EA, 92 MT; 364/481, 556

[56] References Cited

U.S. PATENT DOCUMENTS

| | | | |
|---|---|---|---|
| 3,725,827 | 4/1973 | Slobodnik | 310/313 X |
| 3,735,387 | 5/1973 | Miller | 235/92 EA |
| 3,835,465 | 9/1974 | Tannas et al. | 340/754 |
| 4,083,042 | 4/1978 | Kushin et al. | 340/753 |
| 4,155,084 | 5/1979 | Klees | 340/753 |

*Primary Examiner*—David L. Trafton
*Attorney, Agent, or Firm*—Kenneth A. Seaman

[57] ABSTRACT

A measurement display apparatus and method of generating the display which has improved stability. The display includes plurality of discrete indicators and includes a buffer and a sensor, with a convertor and logic intercoupling the sensor and the buffer. The convertor generates a digital representation of the measurement sensed by the sensor including more significant digits and less significant digits. The less significant digits which are adjacent to transitions of the more significant digits are sensed by the logic and used to inhibit an updating of the buffer when the less significant digits are adjacent to a transition of the more significant digits (i.e., one count more or less in the digital representation causes a change in the more significant digits).

9 Claims, 3 Drawing Figures

| STATE | EXEMPLARY COUNTING SEQUENCE VALUES | | | | | | | | |
|---|---|---|---|---|---|---|---|---|---|
| S1 | 0 | 1 | 1 | 0 | 1 | 0 | 1 | 1 | ← TRANSITION IN MORE DIGITS |
| S2 | 0 | 1 | 1 | 0 | 1 | 1 | 0 | 0 | |
| S3 | 0 | 1 | 1 | 0 | 1 | 1 | 0 | 1 | |
| S4 | 0 | 1 | 1 | 0 | 1 | 1 | 1 | 0 | |
| S5 | 0 | 1 | 1 | 0 | 1 | 1 | 1 | 1 | ← TRANSITION IN MORE SIGNIFICANT DIGITS |
| S6 | 0 | 1 | 1 | 1 | 0 | 0 | 0 | 0 | |
| | A7 | A6 | A5 | A4 | A3 | A2 | A1 | A0 | |

MORE SIGNIFICANT DIGITS (MSD)

TO STORAGE & DISPLAY

LESS SIGNIFICANT DIGITS (LSD)

TO LOGIC

MEASUREMENT INDICATING APPARATUS AND METHOD

FIELD OF INVENTION

The present invention relates to a digital display apparatus for providing readings of measured quantities. More particularly, the present invention includes an apparatus and a method for preventing dither, or rapidly occurring fluctuations, in the display of dimensional measurements in the preferred embodiment.

BACKGROUND OF THE INVENTION

A modern measurement apparatus has the potential for making measurements which are accurate to and displayed in very small increments, perhaps tens of millionths of an inch. Such measurement are very susceptible to very small changes in the measured dimensions (e.g., from small movement of the measuring instrument with respect to the part or internal variation in the instrument). Such very small changes in the measured dimension could affect the displayed measurement which is displayed on one or more of a plurality of discrete indicators. The display might appear to flicker or fluctuate between two or more indicators, presenting a dither, or vacillating display. An operator has difficulty in determining the proper measurement from such a vacillating display.

Several prior art systems have attempted to inhibit the undesirable fluctuations in the display. One example in the prior art uses an averaging technique, where several measurements taken at successive times are combined to produce a more stable display. Another prior art technique slows down the sampling rate and consequently the rate at which the display is updated.

Examples of such prior art systems to suppress flutter in a column display are shown in U.S. Pat. Nos. 3,735,387; 3,769,583; and 3,638,001.

The prior art columns and the control circuitry have undesirable limitations. Further, the circuits are difficult to design and rather costly to make, adding undesirably to the expense of the column.

The foregoing and other limitations and disadvantages of the prior art column gages and the associated control circuitry will be apparent to one skilled in the art in view of the following description of the present invention and the appended drawings.

SUMMARY OF THE INVENTION

The present invention overcomes the disadvantages and limitations of the prior art circuits by providing a control circuit for a column display which is rather simple to design and make and provides an elimination of the unwanted flutter in the output display.

The present invention includes an analog to digital convertor which generates both more significant digits (for display) and less significant (non-displayed) digits, for control (selectively inhibiting) of display changes. The less significant digits are analyzed to determine whether they are adjacent to transitions of the more significant digits, and if so, serves to inhibit the passage of the associated more significant digits to the display.

The present invention accordingly minimizes the chance of undesirable flutter in the column display.

The present invention also allows a fairly rapid column update and a smooth display of position information.

The present invention also achieves the desired economy in design and manufacturing costs by providing a display which has a minimum of parts and interconnections.

The present invention also has the advantage of using commercially available low cost parts in its design.

The foregoing and other objects and advantages of the present invention will be apparent to one skilled in the art in view of the following detailed description of the drawings and claims and the appended drawings.

DETAILED DESCRIPTION OF THE DRAWINGS

Figures 1, 3:
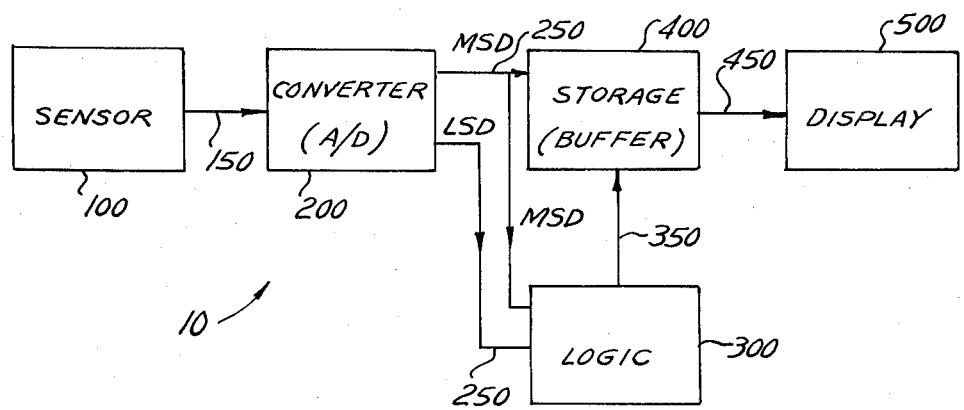
FIG. 1 is a block diagram of the measuring apparatus of the present invention.
FIG. 3 is a chart indicating one exemplary counting sequence through several increments and the generating of more and less significant digits as used in the present invention.

FIG. 1 shows the principle elements of a measuring apparatus 10 of the present invention in a block diagram form.

The measuring apparatus 10 includes a sensor 100 which generates an analog signal and which is coupled to an (analog-to-digital or "A/D") converter 200 by a signal line 150. The converter 200 is coupled to a logic function 300 by a first bus 250 and a second bus 260. The second bus 260 also couples the converter 200 to a buffer or storage 400. The logic function 300 is coupled by a control line 350 to the buffer 400 and serves as an enable (or inhibit) for the buffer as will be discussed in detail later in this application. The buffer 400 is coupled to a display 500 by an appropriate connecting bus 450. The analog signal from a measurement by the sensor 100 is processed through the converter 200, the logic 300 and the buffer 400 to the display 500 to provide a readout of the measurement on the display 500.

In its preferred embodiment, the measurement apparatus 10 is used for dimensional measurement and inspection of parts, although the present invention could be used to advantage in other measuring applications. More particularly, the preferred embodiment has a particular application to the display of dimensions in which an electronic column display has a plurality of discrete indicators, spatially-arranged in a vertical column, such as is shown in U.S. Pat. No. 3,825,827 for "Columnar Display . . . " to Tumbush, which patent is expressly incorporated herein by reference. Each of the discrete indicators is representative of a different dimensional measurement, and adjacent indicators represent a difference of a predetermined (and in some apparatus, adjustable) increment in measurements. The increment between adjacent indicators on the display may be selected between 5 millionths of an inch to 1 ten-thousandth of an inch with current technology.

Figure 2:
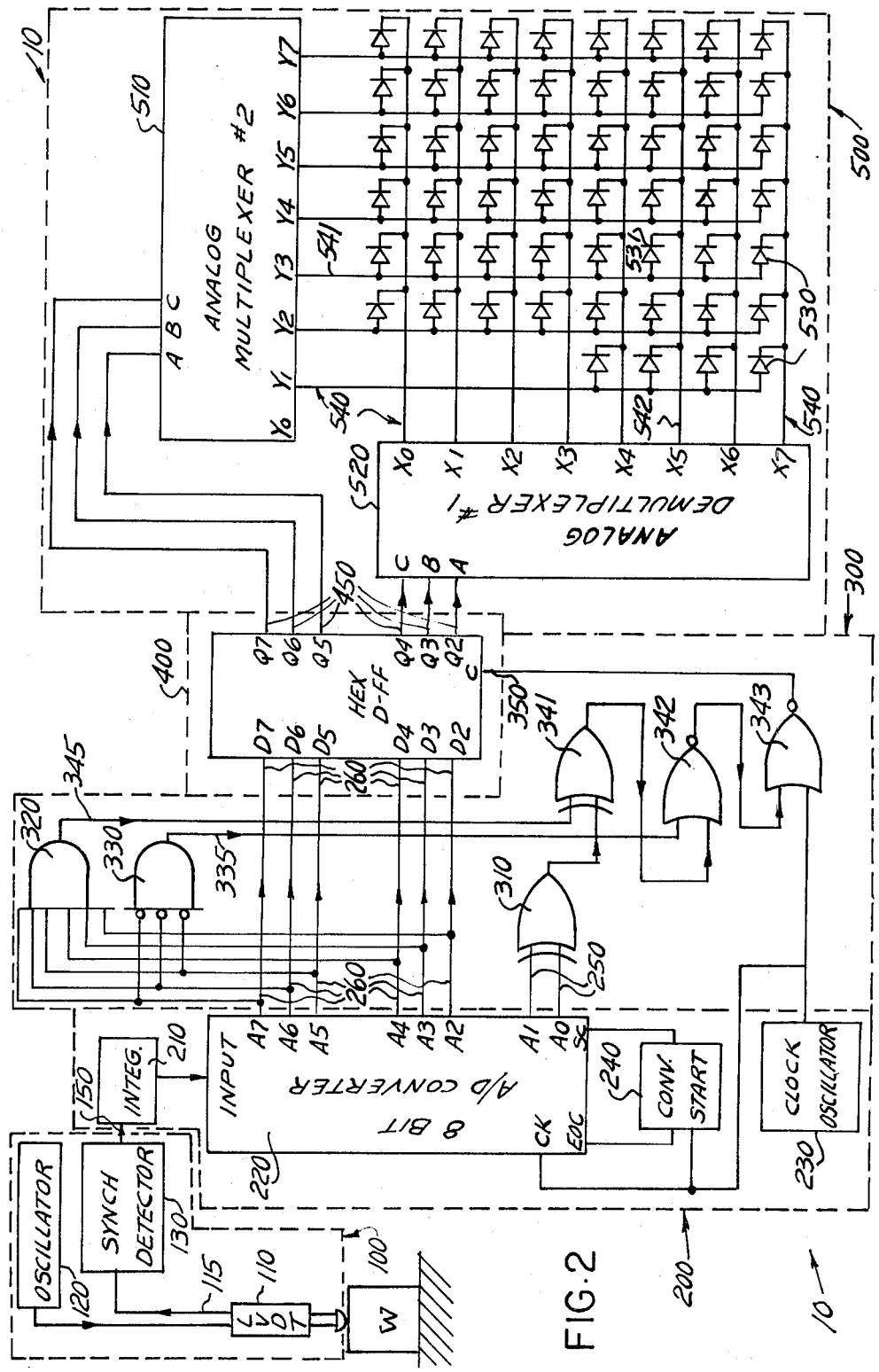
FIG. 2 is an electronic schematic diagram of the novel portion of the present invention.

FIG. 2 is a detailed view of the measuring apparatus 10 for gaging and displaying a measurement of a part or workpiece W. The measuring apparatus 10 generally includes the sensor 100, the converter 200, the logic 300, the storage 400 and the display 500 as described in FIG. 1, which are generally delineated in FIG. 2 by dotted lines which divide the apparatus into component sections.

The sensor 100 includes a transducer 110 of the LVDT type driven by an oscillator 120 which provides a sine wave of a fixed amplitude and phase. The transducer 110 provides a measurement signal on an output line 115 which is coupled to a synchronization detector 130 which amplifies and filters the measurement signal. The entire sensor 100 is well known in the field of dimensional measurement and the transducer 110 in the preferred embodiment is a dimensional measuring transducer which provides an electronic analog signal which varies linearly with its displacement by the part (i.e., the part measurement). Such transducers are well known sold by many manufacturers, including The Bendix Corporation which offers several models of such transducers under its Electrojet trademark.

The converter 200 receives the analog output of the sensor 100 on the signal line 150 and converts it to a digital representation (or output) which is provided on the first and second buses 250, 260. In the embodiment shown, the digital representation of the output is provided in parallel, that is, each bus includes multiple lines, each of which transmits a single bit of binary information. In such a parallel output all transformation is simultaneously available (in contrast to the serial transmission of binary information on a single line, for which the present invention also has application).

The converter 200 includes an integrator 210, an 8-bit A/D converter 220, a clock oscillator 230, and a conversion start circuit 240.

The integrator 210 receives the output of the synchronization detector 130 on line 150 and limits the rate of change of the signal presented to the 8-bit A/D converter 220. The integrator receives a pulsed DC signal and performs an averaging function. While the integrator 210 is not essential in the system (i.e., the averaging function is not required), it is desirable to eliminate a variation in the input signal to the 8-bit A/D converter 220 while it is receiving the input for a given cycle. The integrator also limits the rate of change of the input signal to the converter 220.

The 8-bit A/D converter 220 is a conventional element and commercially available from National Semiconductor as their part number MM 5357N. The converter 220 receives an analog input voltage on one terminal and converts it into a digital (binary) output signal on eight output lines (A0–A7) in parallel. The digital output signal or representation includes digits which are arranged in place value, from the least significant digit (A0) to the greatest significant digit (A7). The least significant digit is understood in the art to be the digit which multiplied by the lowest power of the number system base (i.e., base 2 for binary signals) and the most significant digit is understood to be the digit which is multiplied by the highest power of the base.

For this preferred embodiment, the two least significant digital output lines (A0–A1) are identified as the "less significant digits" (LSD) and are provided on bus 250 (two lines). The other six digital output lines (A2–A7) are identified as the "more significant digits" (MSD) and are provided on the bus 250 (six lines).

The clock oscillator 230 is a free running oscillator or astable multivibrator which produces pulses at a chosen frequency of 8,000 cycles per second.

The converter start circuitry 240 enables the A/D converter 220 to start a conversion cycle and enables the A/D converter only during the conversion cycle. For the preferred embodiment, this enabling is 40 clock pulses.

The logic 300 is responsive to conditions of the less significant digit bus 250 and the clock oscillator 230 to selectively pass a clock oscillation to the storage or buffer 400 on line 350. As an added feature, the logic 300 is also responsive to the more significant digits on the bus 260 to override the considerations of the less significant digits when the more significant digits are at a minimum or maximum display value (essentially, when the display is "off-scale" at either a maximum or a minimum).

As will be apparent from the description of the preferred counting sequence described later in connection with FIG. 3, when both of the less significant digits A0, A1 on the bus 250 are the same, or in parity, the more significant digits are adjacent to a transition of the more significant digits and no change in the display should be allowed. An "XOR" (exclusive-OR) gate 310 generates a control signal indicative of the parity (or lack of parity) of the two digits, one signal when either, but not both, inputs are present.

"AND" gates 320, 330 are coupled to the more significant digit bus 260 to provide signals or lines 325, 335, respectively, when the more significant digits on the bus 260 are off-scale for the display on the high or low side, respectively. When the more significant digits are off-scale, the less significant digits are inhibiting control of the storage through gates 341, 342 and 343. Gate 341 is an "XOR" (exclusive-OR) gate receiving an input from the gate 310 and an input from the "AND" gate 320. The gates 342, 343 are OR gates (with a low true output), with the gate 342 receiving as inputs the output of gates 341 and 330. The gate 343 receives as its inputs the outputs of gate 342 and the clock oscillator 230, and provides its output on the line 350 to the clock of the storage or buffer 400.

The gates 320 and 330 with the logic gates 341, 342, 343 also serve to prevent the initial (random) conditions in the buffer 400 at turn-on from causing an invalid display.

The storage or buffer 400 is a conventional item in such measurement display systems and is a 6-digit D-type flip flop package of the type sold by National Semiconductor as part number 74C174. As described earlier, the clock for this package is provided on line 350 and an update of the data is provided with each clock pulse—that is, the data on the inputs D2–D7 on one clock signal are provided on the outputs Q2–Q7 on the next clock signal. The logic 300, which generally inhibits the generation of a clock pulse when both of the less significant digits are in parity, thus prevents the updating of the buffer when it could present a flickering display (on the edge of a possible transition in displayed values—the more significant digits). The storage 400 is coupled to the converter to receive only the more significant digits on the bus 260 as inputs to the flip flops (i.e., the D inputs).

The buffer 400 has an output bus 450 which is provided to the display 500 in a known manner which is not crucial to the present invention. In this embodiment, the display 500 includes a multiplexer driver 510, and a demultiplexer driver 520 which drive discrete display elements (LEDs) 530 through the connection with an intersecting network 540 of lines coupled to the multiplexer/drivers 510, 520.

While the method of displaying the information is not new or crucial, an example is given for the better understanding of the operation. If Q2–Q7 are 101011 (respectively) the states of Q5–Q7 (011) are provided to the multiplexer 510 and energize output Y3 and line 541. The states of Q2–Q4 (101) are provided to the demultiplexer 520, which de-energizes output X5 and line 542, while the remainder of the output lines from the demultiplexer 520 remain energized. A light-emitting diode (LED) 531 located between the lines 541 and 542 is now properly biased to conduct while the remainder of the LEDs 530 are not biased for conduction and thus remain non-conducting. The conducting of the LED 531 generates a visible display. Preferably, although not shown, the display is arranged with the diodes in a vertical stack one above the other and a scale or value indicator is associated with each diode to provide a measurement value.

FIG. 3 illustrates exemplary counting sequence which is an arbitrarily-chosen portion of the range of digital progression for the A/D converter 220. The counting sequence illustrates the adjacent states in the digital progression. The integrator 210 provides successive analog inputs which cannot vary by more than one binary digit in the least significant digit per clock period and that a second input may be greater or less than a first, so states in which one more or one less count would change the display are significant.

The values of the outputs A0–A7 of the converter 220 are shown at six successive states S1–S6 in the progression. The outputs A0, A1 are less significant digits (LSD) which are provided on the bus 250 (in FIGS. 1 and 2) while the outputs A2–A7 are the more significant digits (MSD) provided on the bus 260 (in FIGS. 1 and 2). Between each successively numbered state there is a difference of one digital count (or analog increment): the state S2 represents a digital value one greater than the state S1, and conversely, the state S1 is a digital value one less than the state S2.

As only the more significant digits (MSD) are displayed, between the states S2 and S5 the display would not change, either with or without the present circuitry and invention. This remains true, whether the output of the integrator 210 is constant (always in the state S5, for instance), or if the output was alternating between two of the included states (e.g., between states S3 and S4). However, between states S5 and S6, the more significant digits (which are displayed) change, so a fluctuation between the states S1 and S2 (or S5 and S6) should not be allowed to change the display. When the count is in any one of such states (S1, S2, S5 and S6) adjacent a transition in the MSD, both of the less significant digits (LSD) are in parity. When the count is not in a state (S3, S4) adjacent a transition in the MSD, the bits are not in parity. This explains why the XOR function of the LSD will provide an indication of the adjacent position in the MSD. When the adjacent position to a change in the MSD is detected, the buffer (and thus the display) is temporarily inhibited from changing by the elimination of the clocking input to the buffer.

Component values and sources are subject to a designer's selection and preference. One skilled in the art should be easily able to design a system using this invention from the description. Typical values and sources of components are:

| Integrator | National LM358N with feedback of a 26.1K resistor in a parallel with a .3 uf capacitor |
| --- | --- |
| XOR Gate 310 | National MM74C86 |
| AND Gate 320 | 2-RCA CD4082 (in series) |
| AND 330 | 2-RCA CD4001 (in series) and an XOR gate |
| XOR Gate 341 | National MM74C86 |
| XOR Gate 342 | National MM74C86 |
| XOR Gate 343 | RCA CD4001 |

While a preferred embodiment of the invention has been disclosed, it will be apparent to those skilled in the art that changes may be made to the invention without departing from the spirit of the invention. In some instances, certain features of the invention may be used to advantage without corresponding use of other features. For example, other counting schemes are known (e.g., Gray code) which could be used with suitable changes to the circuitry. Additionally, the types of measurement, displays and sensors could be changed without significantly changing the use of the present invention. Further, the flutter resistant method and apparatus disclosed in this application are applicable to other types of known displays: e.g., "thermometer effect" displays on a column instrument (where all the indicators below the representative indicator are energized) and to digital readout systems. Accordingly, it is intended that the illustrative and descriptive materials provided in this application be considered only as illustrative of the principles of the present invention and not to limit the scope thereof.

Having thus described the invention, what is claimed is:

1. A method of periodically generating a display of a measurement comprising the steps of:
    periodically generating an analog signal indicative of the measurement;
    converting the analog signal into a digital representation, said representation including a portion of greater significance and a portion of lesser significance;
    displaying on a display the greater significance portion of the digital representation; and
    inhibiting a change in the display in response to predetermined values of the lesser significance portion of the digital representation.

2. A method of generating a display of a measurement of the type described in claim 1 wherein the step of inhibiting the display change includes sensing a state of the lesser significance portion, which state is adjacent to a change in the greater significance portion.

3. An apparatus for displaying a part measurement comprising:
    a transducer for engaging the part to be measured;
    means coupled to the transducer for periodically generating an analog signal representative of the part measurement;
    a converter coupled to the analog signal generating means for receiving the analog signal and translating the analog signal into a digital output having a first and second portions, the first portion being of greater significance and the second portion being of lesser significance;
    a display having a plurality of discrete states, each corresponding to a value of the part measurement; and
    means for reducing oscillations of the display between two adjacent states including means for selectively transmitting the digital output to the display, said oscillation-reducing means including:
 means for generating an enable signal when the second portion of the digital output is in a predetermined state; and
 transmitting means coupled to said display and said converter and responsive to said enable signal, said transmitting means for selectively transmitting the first portion of said digital output from said converter to said display only when the enable signal is present.

4. A display apparatus of the type described in claim 3 wherein the means for periodically generating an analog signal includes a means for limiting the change in analog signals between successively generated analog signals.

5. A display apparatus of the type described in claim 4 wherein the transmitting means comprises a buffer storage including a clock input for receiving clock pulses and a plurality of D-type flip flops, each flip flop having an input and an output and passing an input signal at one clock pulse to the output at the next clock pulse.

6. A display apparatus of the type described in claim 3 wherein the portion of lesser significance includes two digits and the means for generating the enable signal comprises means for generating an enable signal only when the two digits of lesser significance are unequal.

7. A display apparatus of the type described in claim 3 wherein the apparatus further includes means for sensing the more significant portion and for generating an overriding signal, said overriding signal being coupled to said transmitting means to couple the first portion of the digital output from said converter to said display without regard to the enable signal.

8. A method of generating a display of a measurement comprising the steps of:
 developing a sequence of analog signals representing the measurement;
 converting each analog signal to a digital signal having a more significant portion and a less significant portion;
 coupling the more significant portion of the digital signal to the display;
 analyzing the less significant portion and generating an inhibit signal when an increment to, or decrement from, the lesser digital signal portion would cause a change in the more significant portion; and
 decoupling the digital signal from the display in response to the presence of the inhibit signal.

9. An apparatus for displaying a measurement of a part comprising:
 a measuring sensor for generating an analog signal indicative of the measurement of the part;
 a converter coupled to the measurement sensor for receiving the analog signal and converting it to a digital signal, said converter additionally including means for separating said digital signal into a more significant portion including more significant digits and a less significant portion including digits which are less significant than the more significant digits;
 a storage buffer having a data input, a data output, and a clock input, said data input being coupled to the converter for receiving the more significant digits with said storage buffer transmitting data from the data inut to the data output in response to a clock signal on the clock input;
 logic coupled to the clock input of the storage buffer and the less significant digits, said logic for generating or inhibiting the clock signal on the clock input in response to the less significant portion; and
 a dislay including a plurality of discrete display elements, each of said plurality indicative of a different value of the more significant portion of the digital signal, said display being coupled to the data output of the storage buffer to energize at least one display element in response to the data output.

* * * * *